United States Patent
Levi

(10) Patent No.: US 7,179,665 B1
(45) Date of Patent: Feb. 20, 2007

(54) OPTICAL METHOD FOR DETERMINING THE DOPING DEPTH PROFILE IN SILICON

(75) Inventor: Dean Levi, Indian Hills, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 11/060,111

(22) Filed: Feb. 17, 2005

(51) Int. Cl.
*H01L 21/66* (2006.01)

(52) U.S. Cl. .................................. 438/14; 257/E21.53

(58) Field of Classification Search .................... 438/5, 438/7, 10–11, 14, 16–18, 22–24, 29, 31, 34–36, 438/128–130, 141, 142, 149, 161, 104, 347, 438/349, 351, 353, 359, 381, 400, 424, 435, 438/455, 458, 466, 538
See application file for complete search history.

(56) References Cited

U.S. PATENT DOCUMENTS

| | | |
|---|---|---|
| 4,030,836 A | 6/1977 | Smith |
| 4,332,833 A | 6/1982 | Aspnes et al. |
| 4,472,633 A | 9/1984 | Motooka |
| 5,784,167 A | 7/1998 | Ho |
| 5,835,226 A | 11/1998 | Berman et al. |
| 5,900,633 A | 5/1999 | Solomon et al. |
| 6,002,485 A | 12/1999 | Masao |
| 6,093,243 A * | 7/2000 | Okada et al. ................ 117/8 |
| 6,128,084 A | 10/2000 | Nanbu et al. |
| 6,151,119 A | 11/2000 | Campion et al. |
| 6,233,046 B1 | 5/2001 | Alba et al. |
| 6,242,739 B1 | 6/2001 | Cherkassky |
| 6,381,009 B1 | 4/2002 | McGahan |
| 6,605,482 B2 | 8/2003 | Celii et al. |
| 6,671,047 B2 | 12/2003 | Opsal et al. |
| 6,673,637 B2 | 1/2004 | Wack et al. |
| 6,727,108 B2 * | 4/2004 | Eriguchi et al. ............... 438/16 |
| 6,812,045 B1 | 11/2004 | Nikoonahad et al. |
| 6,818,459 B2 | 11/2004 | Wack et al. |
| 6,849,470 B1 | 2/2005 | Eriguchi et al. |
| 6,933,527 B2 * | 8/2005 | Isobe et al. .................. 257/59 |
| 6,946,394 B2 * | 9/2005 | Fielden et al. .............. 438/680 |
| 2002/0102749 A1 * | 8/2002 | Fielden et al. ............... 438/14 |
| 2002/0180961 A1 | 12/2002 | Wack et al. |
| 2002/0180985 A1 | 12/2002 | Wack et al. |
| 2002/0182760 A1 | 12/2002 | Wack et al. |
| 2002/0189986 A1 | 12/2002 | Nikoonahad et al. |
| 2003/0011786 A1 | 1/2003 | Levy et al. |
| 2003/0207476 A1 | 11/2003 | Eriguchi et al. |
| 2004/0092045 A1 | 5/2004 | Bultman et al. |
| 2004/0115843 A1 * | 6/2004 | Wack et al. .................. 438/14 |
| 2004/0235205 A1 | 11/2004 | Levy et al. |

* cited by examiner

*Primary Examiner*—Michael Lebentritt
*Assistant Examiner*—Andre' Stevenson
(74) *Attorney, Agent, or Firm*—Paul J. White

(57) ABSTRACT

A method of processing a sample, comprising the steps of: introducing dopant into a sample thereby producing a doped sample; producing a healed sampled including a doping density profile in response to introducing the dopant into the sample; and measuring the doping density profile of the healed sample by performing reflectometry using light generated within the visible wavelength spectrum.

19 Claims, 8 Drawing Sheets

OPTICAL METHOD FOR DETERMINING THE DOPING DEPTH PROFILE IN SILICON

TECHNICAL FIELD OF THE INVENTION

Figure 1:
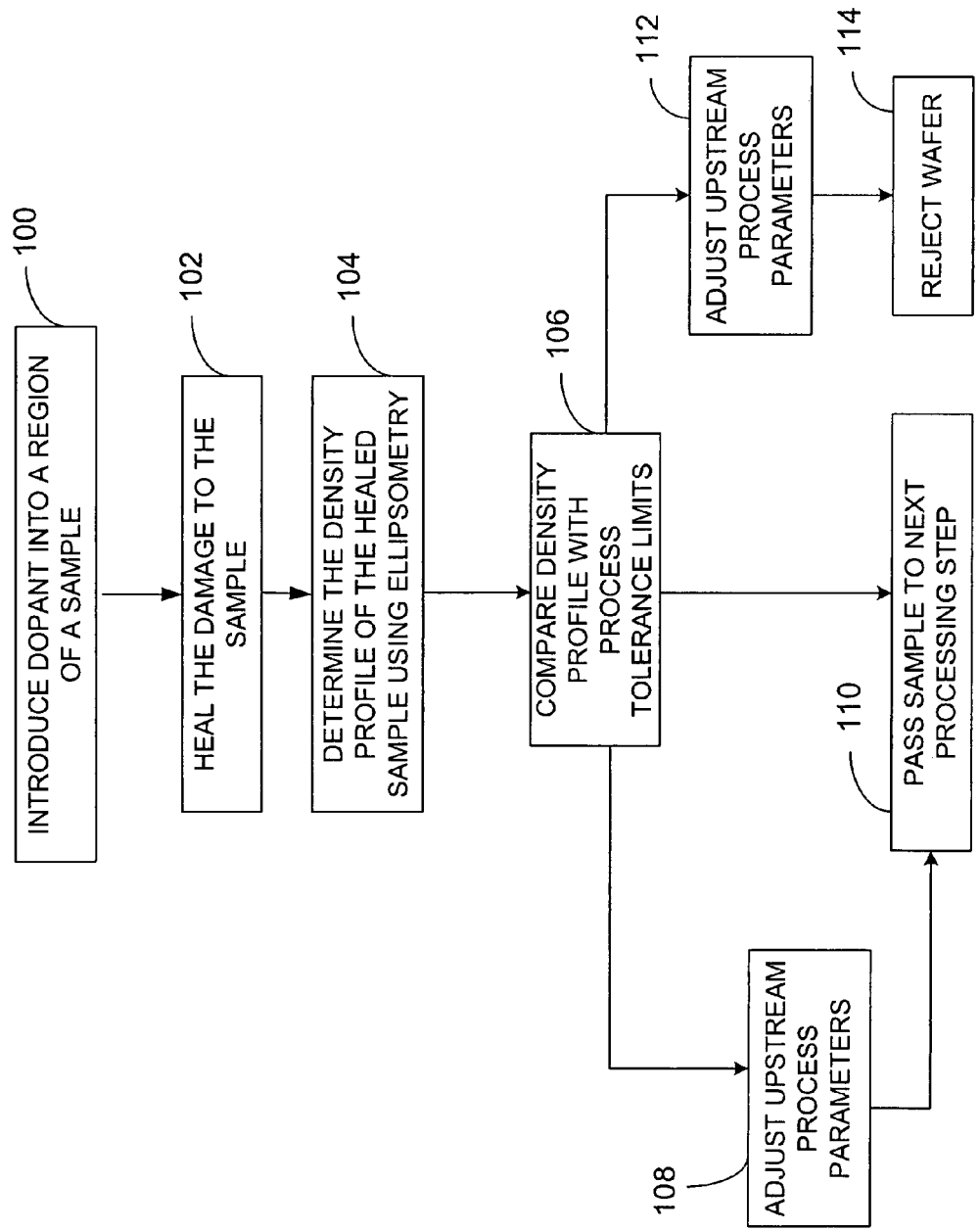

This invention relates in general to semiconductor device manufacturing, and more specifically, to a process for monitoring the thickness and doping density of doped layers in a semiconductor device.

RELATED ART

As the technology of semiconductor-integrated circuits continues to progress, there is a drive to reduce circuit dimensions in order to increase processor speed, power, and memory capacity while reducing electrical power consumption. According to the 2001 International Technology Roadmap for Semiconductors (ITRS) (San Jose: Semiconductor Industry Association, 1999), this requires the junction depth be reduced concurrent with lateral feature size. The present 2004 specification of 100 nanometers, (nm) junction depth is projected to drop to 70 nm in 2008, 50 nm in 2011, and 35 nm by 2014. This so called ultra-shallow junction (USJ) technology is already pushing the limits of current technologies for junction formation and front end of line (FEOL) metrology. Diffusion doping of integrated circuits (IC) is giving way to ion-implantation followed by rapid thermal annealing (RTA) in order to achieve the very shallow penetration of dopant atoms required for USJ circuits.

Such shallow doping profiles lead to very tight tolerance requirements because of the large sensitivity of semiconductor device parameters to process conditions, such as doping density and junction depth. Variation of junction depth by as little as 1 nm can significantly impact device parameters. Traditional metrology techniques for determining doping density and junction depth are four point probe (FPP) and secondary ion mass spectroscopy (SIMS), respectively. FPP requires electrical contact over relatively large areas, while SIMS is time-consuming and destroys the area sampled. Both techniques require that test wafers be pulled from the production line and take significant time to produce results. In a manufacturing environment, off-line test wafer monitoring tends to be infrequent because processing of non-product wafers reduces implanter and RTA productivity. This problem is exacerbated as manufacturers go to larger and larger wafers. IC manufacturers are currently transitioning to 300 mm (12 inch) diameter wafers. At this size, it is highly desirable to monitor junction depth and doping density for every wafer.

Thus, there is a need for rapid, non-contact, non-destructive in-line measurement of critical process parameters.

SUMMARY

In accordance with the teachings of the present invention, in the visible spectrum, a change in the optical properties of a sample based on the presence of dopant atoms introduced into the sample is identified. The change in the optical properties of the sample is used to measure the concentration of dopant as a function of depth (i.e., doping density profile). The doping density profile is then used in an IC manufacturing process.

A method is presented that enables operators to monitor process results for every wafer at appropriate steps of IC processing. Operators will be able to dynamically adjust process parameters before tolerance limits are exceeded. This in turn will enhance manufacturing productivity and reduce cost.

In accordance with the teachings of the present invention, changes in the optical properties of silicon in the visible spectrum, as a function of the dopant density, are used to determine thickness and doping density profile in a semiconductor sample. The changes in the optical properties are determined using a reflectometer, such as an ellipsometer. In one embodiment, the sample includes a first region of material that is directly exposed to the dopant and a second layer of material that is not directly exposed to the dopant. In one embodiment, both the first region and second region of material are silicon. For example, in one embodiment, the sample is a crystal silicon wafer.

The method comprises generating at least one predicted behavior curve associated with the change in optical properties as a function of doping density. The predicted behavior curve includes at least one expected optical measurement and the depth profile associated with the density of dopant atoms versus depth. The method also includes emitting light onto the surface of the sample and collecting at least one optical measurement from the light that is reflected from the sample. In addition, the method includes comparing the results of the optical measurement to the predicted behavior curve and determining the depth profile of the dopant atoms based on the comparison between the measured and predicted behavior.

DRAWINGS

Figure 2:
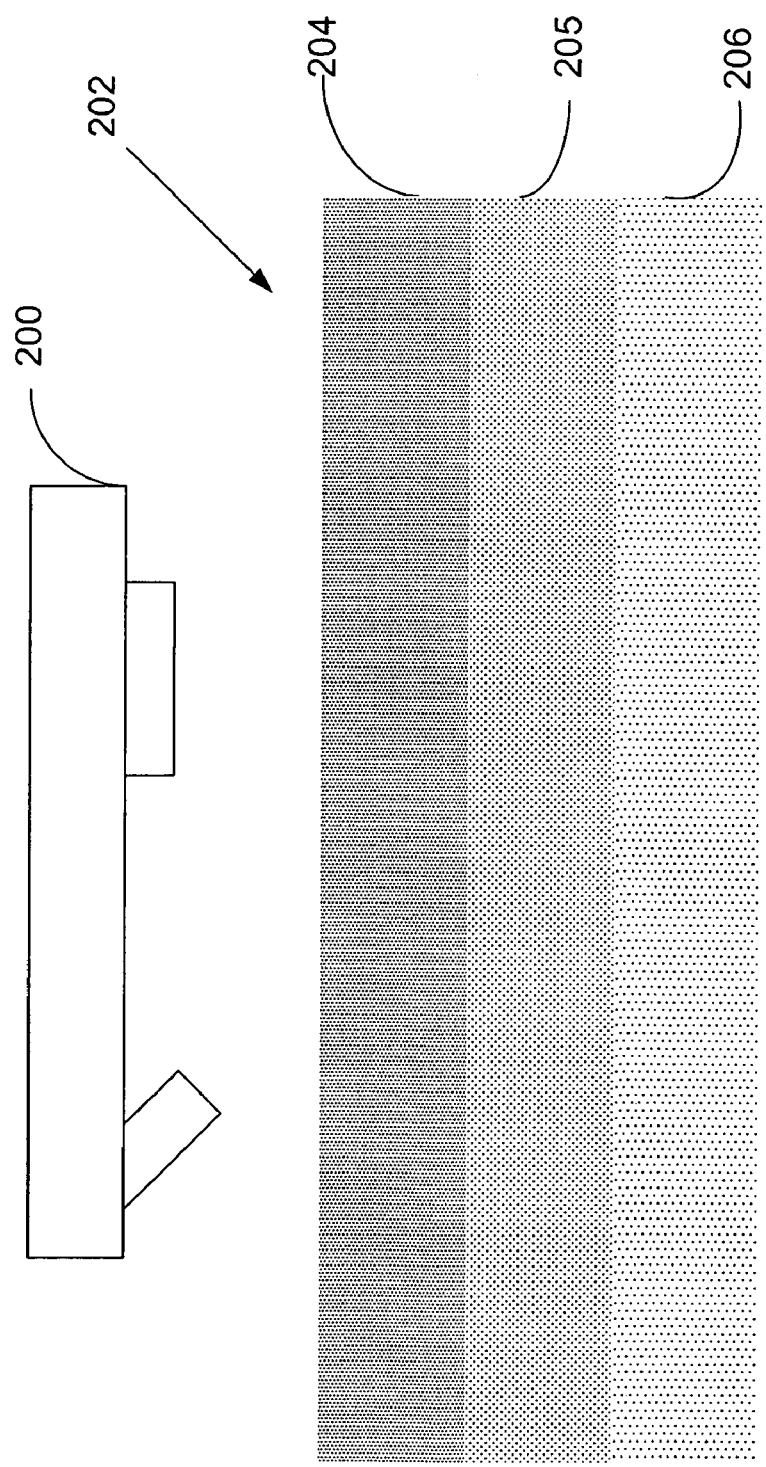
Figure 3:
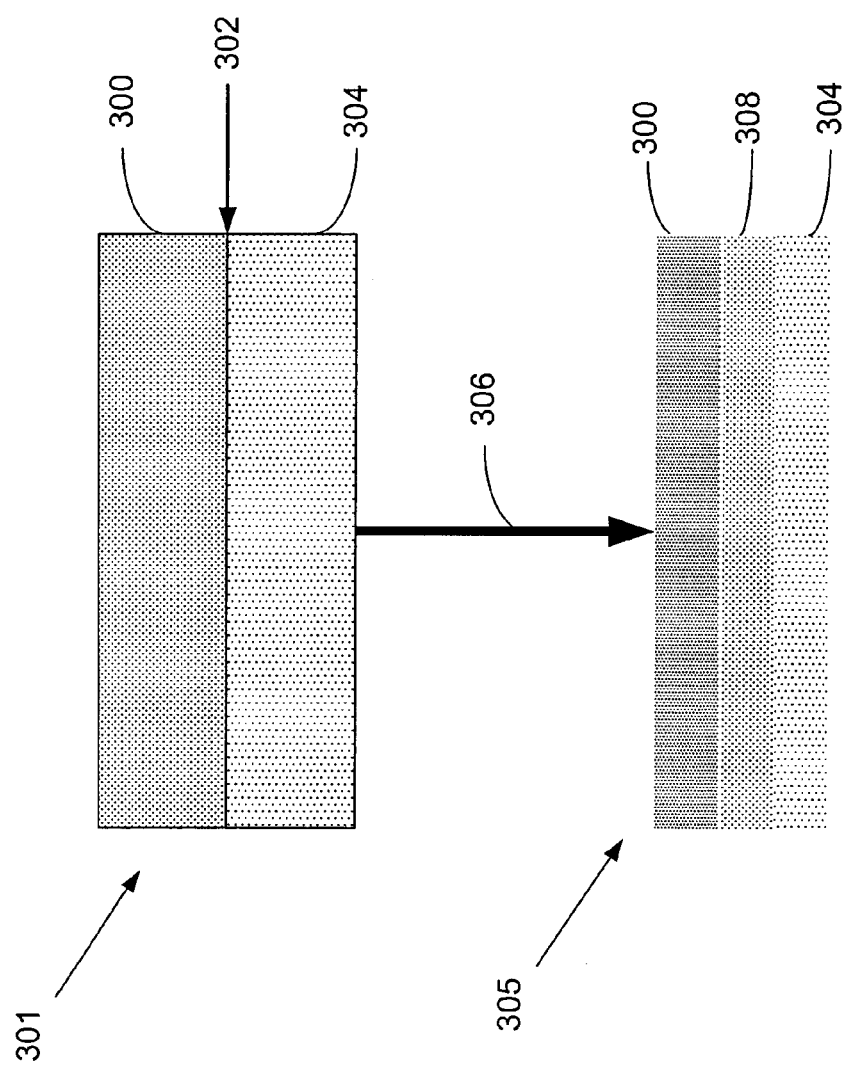
Figure 4:
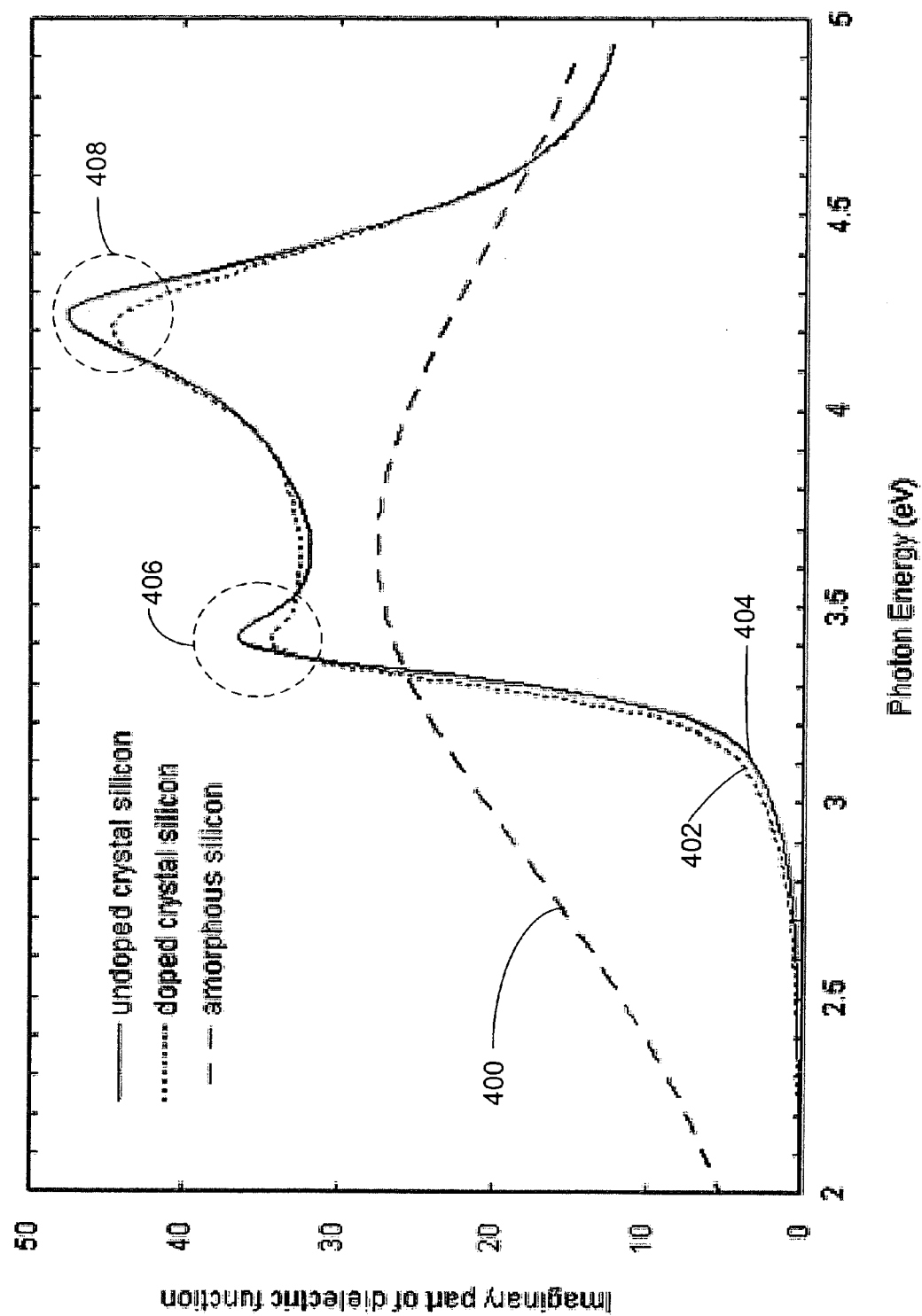
Figure 5:
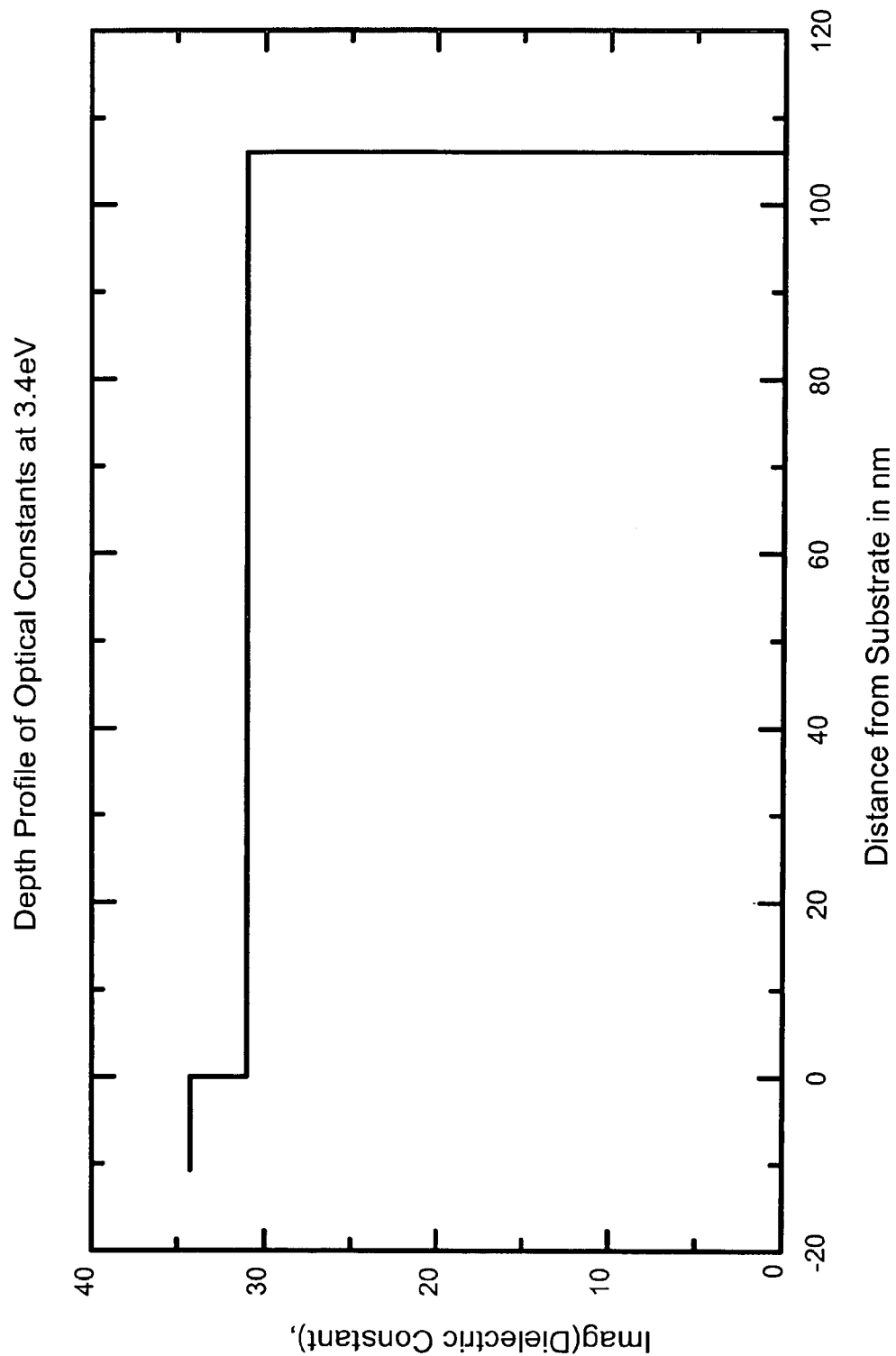
Figure 6:
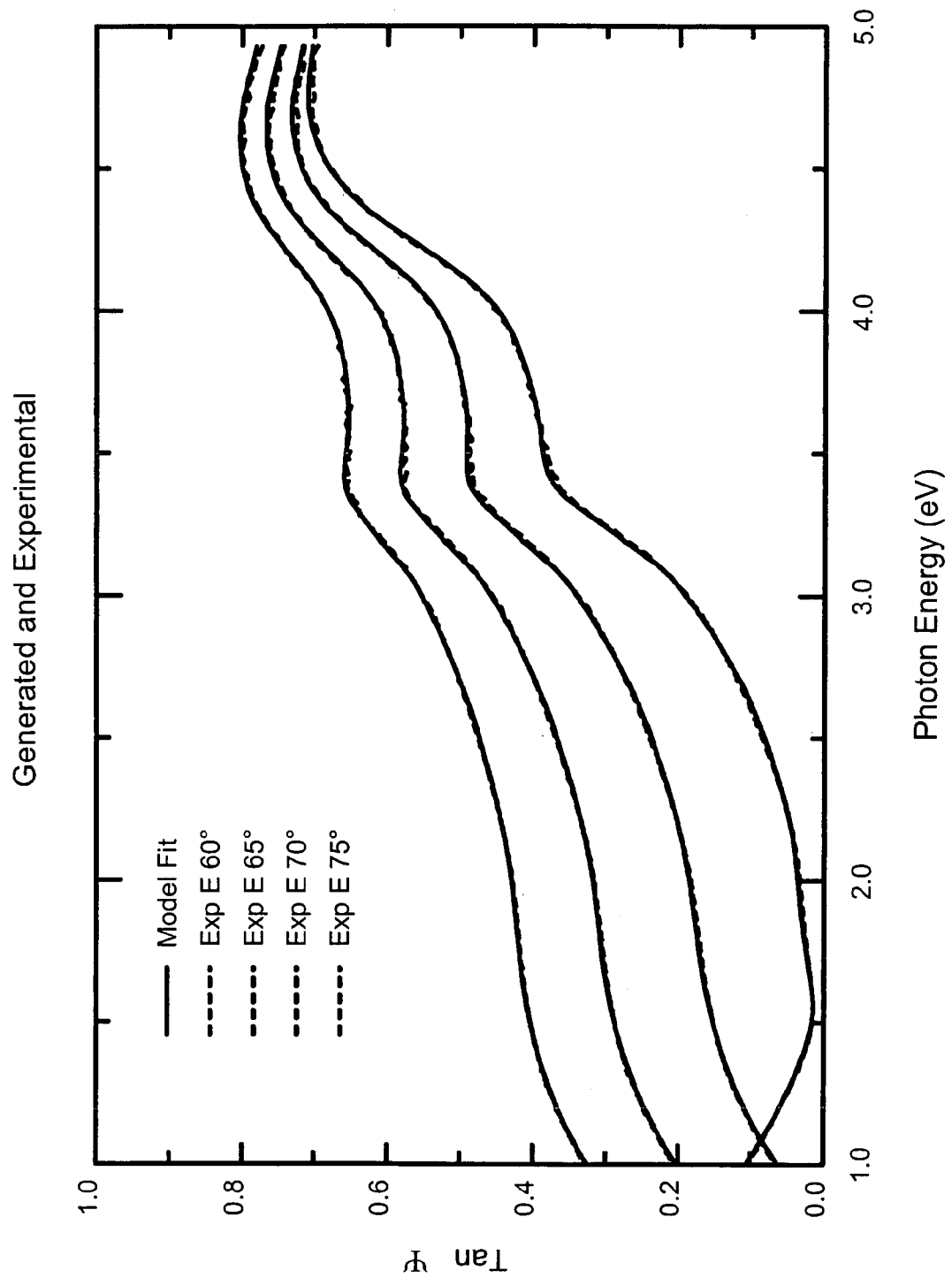
Figure 7:
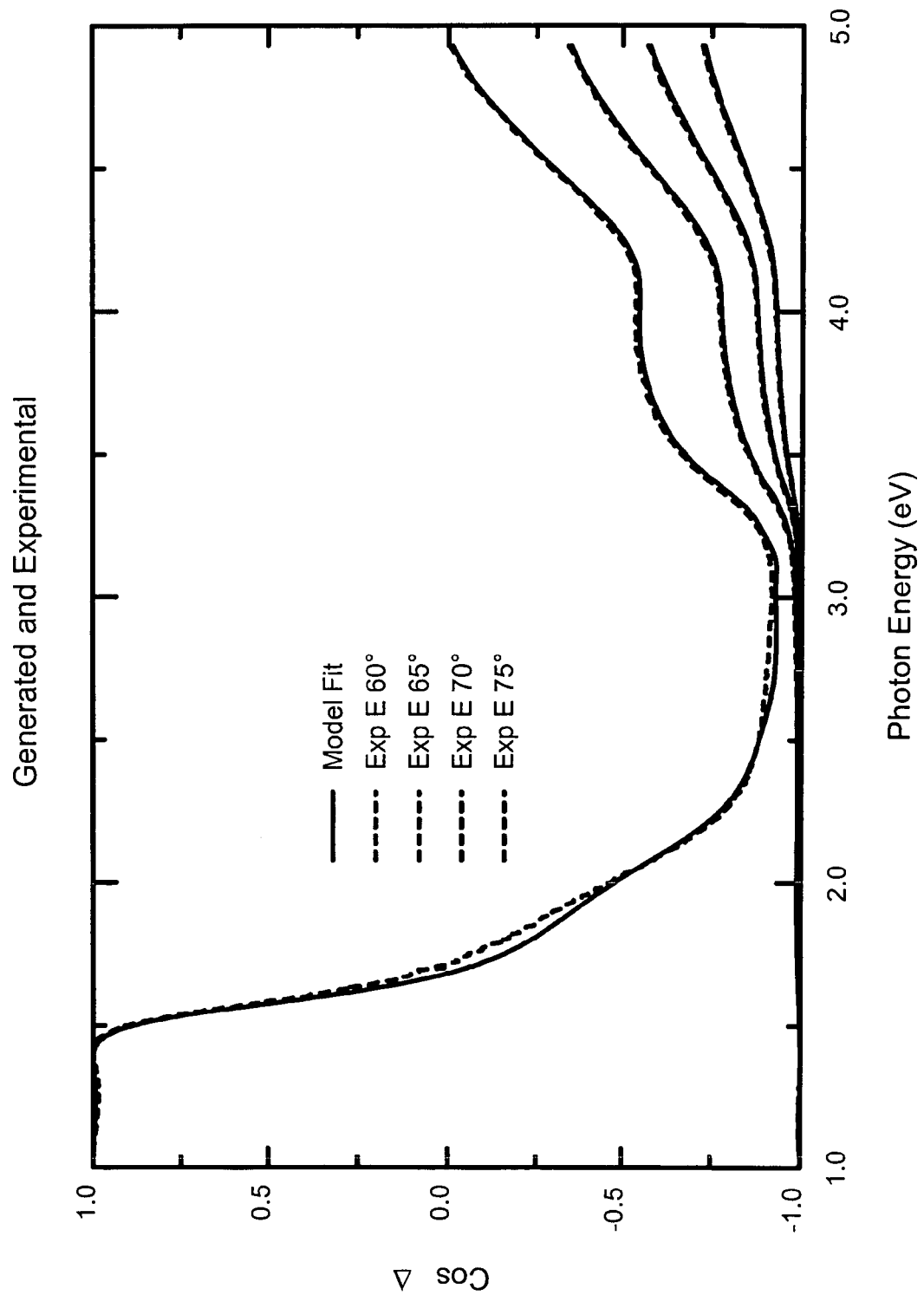
Figure 8:
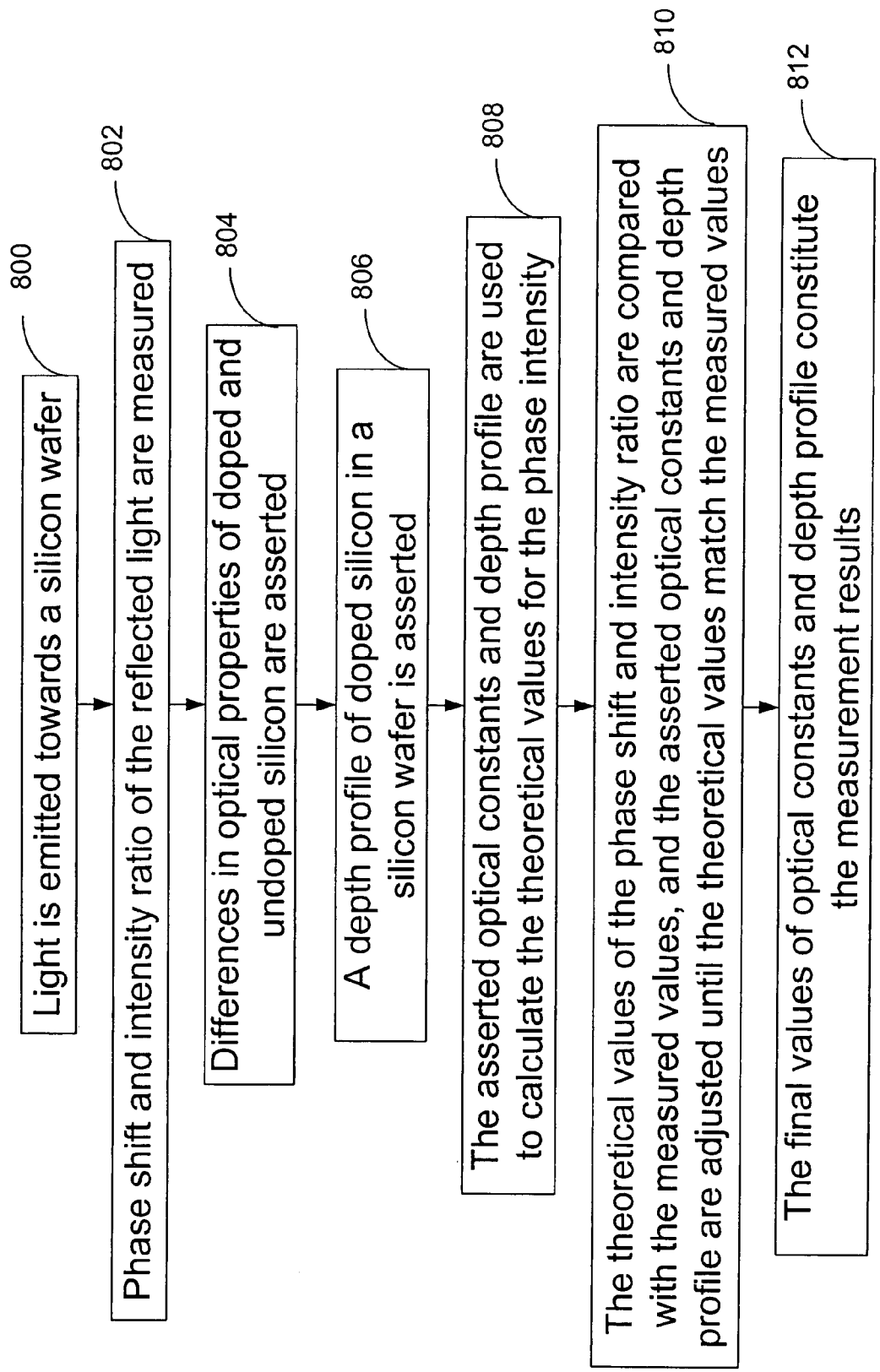

FIG. 1 displays a flow diagram depicting a method of determining a doping density profile of a sample in accordance with the teachings of the present invention;

FIG. 2 displays a representation of an Ellipsometer and a sample used to discuss the teachings of the present invention;

FIG. 3 displays a representation of a sample prior to and after a healing step;

FIG. 4 displays a graph of the optical properties of silicon;

FIG. 5 displays a graph of depth profile of optical constants at 3.4 ev;

FIG. 6 displays a graph showing a fit for generated and experimental data as a function of $Tan(\Psi)$;

FIG. 7 displays a graph showing a fit for generated and experimental data as a function of $Cos(\Delta)$; and FIG. 8 displays a flow diagram depicting one embodiment of a manufacturing method implemented in accordance with the teachings of the present invention.

DETAILED DESCRIPTION

In accordance with the teachings of the present invention, in one embodiment, distinctions have been identified between the optical properties of a semiconductor sample when tested using light generated in the visible wavelength range. The distinctions are used to determine the concentration of the dopant as a function of depth (i.e., doping density profile). In another embodiment, the doping density profile is used in an integrated circuit (IC) manufacturing process.

FIG. 1 displays a flow diagram depicting a method of doping a sample and determining a doping density profile of a sample in accordance with the teachings of the present invention. The objective of the method is to introduce impurity atoms (i.e., dopants) at some controlled depth and some controlled density into a region of a sample, such as a crystal silicon wafer. In one embodiment, the dopant is introduced into the near surface region of a bulk or single-layer semiconductor (i.e., crystal silicon wafer). In one embodiment, the method depicted in FIG. 1 may be used to test, analyze, and/or control the dopant introduced into the sample. For example, the method depicted in FIG. 1 may be used as part of an inline IC manufacturing technique.

At step 100, dopant is introduced into the near surface region of the sample. A variety of different samples may be provided. For example, a single-layer semiconductor sample may be provided. With a single-layer semiconductor sample, the dopant may be introduced into one region, which may be referred to as a doped region. As such, the single layer of semiconductor sample will include both a doped region and an undoped region. Alternately, a first layer of doped semiconductor material may be deposited on a second layer of undoped of semiconductor material. As in the previous example, the first layer would be considered a first region and the second layer may be considered an undoped region. It should be appreciated that any combination of the foregoing is within the scope of the present invention. Therefore, a sample comprising a single layer of semiconductor material or multiple layers of semiconductor materials are within the scope of the present invention.

In another embodiment, prior to the ion implantation step used for doping, the crystal silicon wafer may be bombarded with neutral atoms, such as silicon or germanium atoms, in order to create a region of undoped amorphous silicon at the surface of the silicon wafer. Such pre-amorphising implants (PAI) are used to provide greater control over the distribution of dopant atoms produced in subsequent ion-implantation steps. In this scenario, the silicon wafer may include a first region of undoped amorphous silicon and a second region of undoped crystal silicon. Once the ion-implantation step is performed, the dopant atoms may be distributed through part of the depth of the amorphous silicon, through all of the depth of the amorphous silicon or through all of the depth of the amorphous silicon and partially into the crystal silicon region. This method of introduction of dopant atoms is within the scope of the present invention.

In addition to the type of sample, the dopant may be introduced into the sample using a variety of procedures. It should be appreciated that any method of introducing a dopant into a sample, whether the sample is a single layer or multiple layers, is within the scope of the present invention. For example, in one embodiment, the dopant may be introduced into the sample and disperse through the sample using a diffusion technique. In another embodiment, the dopant may be introduced into the sample using ion implantation. In yet another embodiment, one layer may be deposited on another layer. For example, a doped layer of crystal silicon may be deposited on another layer of crystal silicon.

In one embodiment, a semiconductor sample including two regions of crystal silicon is provided. For example, the semiconductor sample may include a first region of undoped crystal silicon and a second region of undoped crystal silicon. A dopant may be introduced into the near surface region of the first region of undoped crystal silicon. Once dopant is introduced into the first region of undoped crystal silicon, the first region of crystal silicon becomes a doped region of silicon or "doped silicon." As mentioned previously, there are a variety of techniques for introducing the dopant into the near-surface region of the semiconductor sample. Each of these techniques is within the scope of the present invention.

Reflectometry testing is performed to determine the composition profile of the sample. For example, ion implantation can destroy the crystal order of silicon atoms in the silicon wafer, producing amorphous silicon. Thus, the implanted region of the sample may consist of a mixture of amorphous silicon, doped crystal silicon, and undoped crystal silicon. The reflectometry measurement may be used to determine if the composition profile, expressed in terms of the volume fractions of amorphous silicon, doped crystal silicon, and undoped crystal silicon versus depth into the sample, matches the desired composition profile. If the appropriate composition profile has not been reached when tested, then the method may introduce more dopant or apply some other process, such as annealing.

In one embodiment, the first region of crystal silicon is damaged when the dopant is introduced into the semiconductor sample. As a result, the damage sampled is healed as stated at step 102. The step of healing the doped silicon may occur in one step or may occur in several steps. In addition, a variety of techniques may be used to heal the doped silicon. For example, at least one annealing step may be used to heal the doped crystal silicon. It should also be appreciated that healing may partially repair the doped layer of crystal silicon, healing may fully repair the doped layer of crystal silicon or any variation in between. Each of these scenarios is contemplated and within the scope of the present invention.

In accordance with the teachings of the present invention, once the semiconductor sample has been healed, there may not be any distinct interface between the first region, which is the doped crystal silicon region, and the second region, which is the undoped crystal silicon region. When there is no distinct interface between the doped crystal silicon region and the undoped crystal silicon region, we refer to the sample as a "healed" sample.

There are a variety of different ways of characterizing a "healed" sample. In one embodiment, after one healing step, a sample may be considered healed if there is no distinct interface between the doped region of crystal silicon and the undoped region of crystal silicon. In a second embodiment, the sample may be characterized by the concentration or distribution of dopant within the doped region after one healing step. For example, in one specific profile (i.e., one embodiment), the concentration of the dopant may be characterized as being at a high uniform level for some depth into the first region and then the concentration may gradually drop off over some distance and then drop down to whatever the nominal level is in the remainder of the sample (i.e., first region or second region depending on the depth of penetration of the dopant). The sample has a gradual decrease in the concentration of the dopant over some depth of the sample. As such, there is no distinct interface in the sample and this sample may be considered a healed sample. In a third embodiment, there is no distinct interface and there is a match between the crystal lattice of the doped region and the crystal lattice of the undoped region, so the sample may be characterized as healed. In the foregoing example, this would correspond to the crystal lattice of the first region, the doped crystal silicon region, and the crystal lattice of the undoped region, the undoped region.

It should be appreciated that after a healing step, the crystal lattice of the doped layer of crystal silicon may be perfect or in the alternative, the crystal lattice of the doped silicon may be near perfect. Both scenarios are contemplated and within the scope of the present invention.

At step 104, the doping density profile of the healed sample is determined using reflectometry. At step 106, a comparison is made to determine if the density profile is within process tolerance limits. The density profile may be within limits, but not the optimum depth profile; the density profile may be optimum; or the density profile may be outside of the tolerance limits. Each of these scenarios is addressed in turn. If the density profile is within limits, but not the optimum depth profile, then at 108 the upstream process parameters are adjusted. Adjusting the upstream parameters may include reprocessing of the current wafer, changing the process for subsequent wafers or any variation of the two. Adjusting the process parameters will inhibit the samples drifting from an optimum range and ultimately enables process control of the manufacturing process. After adjusting the upstream process parameters as stated at 108, the sample is then passed to the next processing step as stated at 110. If the density profile is optimum then the sample is passed to the next step 110. Lastly, if the density profile is outside of tolerance limits then the upstream parameters are adjusted as stated at 112. In addition, the sample is rejected as stated at 114.

The method depicted by the flow diagram of FIG. 1 utilizes the change in the optical properties of a sample to measure the doping density profile, which is then used in an IC manufacturing process. For example, at step 100, the dopant may be introduced into the near-surface region of a sample using ion implantation. The sample in this case may be a single silicon wafer. A healing step is performed as stated at step 102. The healing step performed at step 102 may be implemented by performing annealing, such as rapid thermal annealing, laser annealing, etc. At step 104, the doping density profile may be determined using an ellipsometer. This step may include both the collection and analysis of the data. At step 106 a comparison is made to determine whether the sample is within tolerances. The determination will be made on specific predefined criteria established for the manufacture of the IC. If the density profile is within limits, but not the optimum depth profile, then at 108 the upstream process parameters are adjusted. Adjusting the upstream parameters may include reprocessing of the current wafer, changing the process for subsequent wafers or any variation of the two. Adjusting the process parameters will inhibit the samples drifting from an optimum range and ultimately enables process control of the manufacturing process. After adjusting the upstream process parameters as stated at 108, the sample is then passed to the next processing step as stated at 110. If the density profile is optimum then the sample is passed to the next step 110. Lastly, if the density profile is outside of tolerance limits then the upstream parameters are adjusted as stated at 112. In addition, the sample is rejected as stated at 114. Using the foregoing four steps, an inline assessment of the doping density profile of the IC can be determined. Once the correct doping density profile is implemented in the sample, a number of additional manufacturing steps may be accomplished to produce an IC product.

FIG. 2 displays a representation of an Ellipsometer and a sample used to discuss the teachings of the present invention.

The healed sample 202 is presented with three regions (204, 205,206) to highlight the relationship between the concentration of the dopant as a function of depth, in a healed sample 202. The reflectometer 200 is used to direct light toward a healed sample 202 and then capture light reflected from the healed sample 202 to measure the doping density profile in the healed sample 202. In one embodiment, the healed sample 202 includes a layer that receives the dopant, which is referred to as the doped region of crystal silicon 204 covering a region that did not directly receive the dopant, referred to as the undoped region of crystal silicon 206. In the sample 202, there is no distinct interface between the region that received the dopant (i.e., the doped region of crystal silicon 204) and the region that did not directly receive the dopant (i.e., the undoped region of crystal silicon 206). Instead, an intermediate region 205 is shown. In one embodiment, the concentration of the dopant may be characterized as being at a high uniform level for some depth into the region that received the dopant (i.e., doped region of crystal silicon 204) and then the concentration of dopant gradually decreases over some distance through the intermediate region 205 and then drops down to whatever the nominal level is in the region that did not directly receive the dopant (i.e., the undoped region of crystal silicon 206).

The healed sample 202 in FIG. 2 demonstrates that there is no distinct interface between the doped region of crystal silicon 204 and the undoped region of crystal silicon 206. The dopant introduced into the doped region of crystal silicon 204 gradually decreases throughout the healed sample 202. The intermediate region 205 is provided to depict the gradient of the dopant across the healed sample 202.

It should be appreciated that the dopant may change uniformly or non-uniformly through the healed sample 202. In addition, it should be appreciated that the dopant may diffuse, be implanted, etc. through just the doped region of crystal silicon 204 or through both the doped region of crystal silicon 204 and the undoped region of crystal silicon 206. For example, in a two-layer sample, if the dopant diffuses through the first layer of the sample, then the doped region of crystal silicon 204 and the intermediate region 205 may span the first layer of the sample. If the dopant diffuses through both the first layer of the sample and the second layer of the sample, then the intermediate region 205 may span both the first layer and the second layer of the sample. In each of the foregoing scenarios, there is no distinct interface between the doped region of crystal silicon 204 and the undoped region of crystal silicon 206. In accordance with the teachings of the present invention, the doping density profile may be determined for a healed sample 202 that does not have a distinct interface.

FIG. 3 displays a representation of a sample before and after at least one healing step, such as the healing step shown as 102 in FIG. 1. In FIG. 3, a first sample 301 is shown. The first sample 301 represents a sample prior to a healing step. For example, dopant may be introduced into the sample using ion implantation. The first sample 301 includes a region that received a dopant (i.e., a region of doped amorphous silicon 300) and a region that did not directly receive the dopant (i.e., an undoped region of crystal silicon 304). A second sample 305 is shown. The second sample 305 represents the first sample 301 after a healing step. The second sample 305 includes a region that received the dopant (i.e., a region of doped amorphous silicon 300), an intermediate region 308, and the region that did not directly receive the dopant (i.e., undoped region of crystal silicon 304). The doped layer of crystal silicon shown in the second sample 305 consists of crystal silicon with some dependence of doping concentration and depth, which may or may not correspond to the initial thickness of the region of doped amorphous silicon shown as 300 of the first sample 301.

In FIG. 3, a region of doped amorphous silicon 300 of first sample 301 covers an undoped region of crystal silicon 304 of first sample 301. A distinct interface 302 is shown between the region of doped amorphous silicon 300 of first sample 301 and the undoped region of crystal silicon 304 of first sample 301. It should be appreciated that in another embodiment, interface 302 may also be gradual.

The concentration of dopant introduced in a sample may change at a rapid rate through the sample or may change more slowly through the sample. For example, when the doping density profile decreases rapidly in a sample, a distinct interface, such as an interface shown as 302, maybe present. In one embodiment, the distinct interface may be characterized as a step function based on a sharp change in the concentration of dopant. In these scenarios, the change in the dopant occurs over a relatively short distance compared to the overall thickness of the sample, so the doped region may have a fairly abrupt ending and create a distinct interface. In another embodiment, the change in the concentration of dopant is more gradual resulting in a thicker interface and a less distinct interface. It should be appreciated that both a sharp or gradual interface are contemplated and within the scope of the present invention.

After a healing step represented by 306, there is no distinct interface in second sample 305, such as the distinct interface 302 in first sample 301. Instead an intermediate region 308 is shown. In one embodiment, the concentration of the dopant in second sample 305 may be characterized as being at a high uniform level for some depth into the region that received the dopant (i.e., region of doped amorphous silicon 300 of second sample 305) and then the concentration of dopant gradually decreases over some distance through the intermediate region 308 and then drops down to whatever the nominal level is in the layer that did not directly receive the dopant (i.e., the undoped region of crystal silicon 304 of second sample 305).

There is no distinct interface (e.g., such as 302 of first sample 301) in the second sample 305 after the healing step 306. It should also be appreciated that there is little or no imperfection in the crystal lattice of the second sample 305. In other words, the region of doped crystal silicon 300 of second sample 305, the intermediate region 308 of second sample 305, and the undoped region of crystal silicon 304 of second sample 305 each have the same crystal lattice or nearly the same crystal lattice structure, such that there is no distinct interface between them.

In accordance with the teachings of the present invention, the doping density profile in a sample without a distinct interface, such as second sample 305, may be determined using reflectometry. Specifically, in the visible spectrum, a change in the optical properties of a sample based on the presence of dopant atoms introduced into the sample is identified. The change in the optical properties of the sample is used to measure the density of a dopant as a function of depth (i.e., doping density profile). In one embodiment, the change in optical properties of second sample 305, when tested using light generated in the visible wavelength range, is used to determine the doping density profile in the second sample 305. In one embodiment, a visible wavelength range of about 3–5 eV of photon energy is within the scope of the present invention.

FIG. 4 displays a graph of the optical properties of silicon expressed in terms of the imaginary part of the dielectric function ($\in_2$). In accordance with the teachings of the present invention, reflectometry is used to characterize the doping density based on changes in the optical properties produced by doping. The distinction between the optical properties of doped crystal silicon and the optical properties of undoped crystal silicon are shown for a doping density of approximately $5 \times 10^{18}$ per cubic centimeter in the graph displayed in FIG. 4. A graph of $\in_2$ for both doped and undoped amorphous silicon is shown as 400 in FIG. 4. A graph $\in_2$ of undoped crystal silicon is shown as 404 in FIG. 4. A graph of $\in_2$ of doped crystal silicon is shown as 402 in FIG. 4. It is clear that the doped crystal silicon 402 can be distinguished from the undoped crystal silicon 404 based on their optical properties.

There are two distinct peaks in the visible spectral range in the imaginary part of the dielectric function of crystal silicon. The E1 peak is shown as 406 and the E2 peak is shown as 408 in FIG. 4. Similar and/or related structures exist in the real part of the dielectric function, the index of refraction, the extinction coefficient, reflectivity, or any other method of expressing the optical properties. E1, shown as 406, is at approximately 3.4 ev and E2, shown as 408, is at approximately 4.2 ev. In accordance with the teachings of the present invention, the two peaks, E1 shown as 406 and E2 shown as 408, are two distinguishing characteristics that are used to monitor how the optical properties change with doping density. The energy positions of E1 shown as 406 and E2 shown as 408 shift toward lower energies as the doping in the sample is increased. In addition, the sharpness of the E1 and E2 are decreased (increased broadening) with increased doping density. Therefore, the continuous change in the optical properties of silicon with doping can be expressed in terms of several parameters; namely decreasing of the E1 (i.e., 406) and E2 (i.e., 408) peak energies and broadening of the E1 (i.e., 406) and E2 (i.e., 408) line widths. There is an energy shift in the two peaks as a function of doping density and a broadening of the two peaks as a function of doping density. This is a parametric method of expressing how the optical properties change with doping. The energy position and the broadening of the two peaks are related to the doping density. The change in the optical properties of the sample in the visible spectrum is based on the presence of dopant atoms and how the dopant atoms perturb the electronic structure of the sample. This change in optical properties in the visible spectral region (~3.0–5.0 eV) with doping is an effect that is observed in interband optical transitions, in clear distinction to the free-carrier absorption effects observed in the infrared spectral range, which are due to intraband transitions.

There are several methods for specifying the doping density based on the optical properties. In one method, the change in the optical properties as a function of doping density is calibrated by measuring the optical properties of silicon for a wide range different doping densities. This creates a look-up table of optical spectra (i.e., dielectric function versus energy) as a function of doping density. Using this method, we can specify the optical properties of silicon based on a single parameter, the doping density. The optical properties of a silicon wafer with a doping density depth profile can be calculated by specifying an optical spectrum for each doping density that exists within the wafer. This provides a depth profile of optical spectra. This depth profile can be used to generate a mathematical model with discrete layers that correspond to different dopant concentrations. The composite optical response of the wafer can be calculated using standard analytical techniques commonly used in reflectometry-based analysis, such as ellipsometry.

In a second method, the optical properties are expressed as a mathematical function. A finite number of parameters (i.e., 10, 20 parameters) are then chosen for use in the mathematical function. Using a calibration procedure as described above, the change in parameters are defined based on the single parameter of doping density. As a result, using the single parameter of the doping density, the mathematical function can be used to generate the optical spectrum or dielectric function.

FIG. 5 displays a graph of the depth profile of the imaginary part of the dielectric function at 3.4 eV. This figure shows the depth profile of the imaginary part of the dielectric function $\in_2$ for an ion-implanted and annealed silicon wafer. This graph plots $\in_2$ at a photon energy of 3.4 eV, which is the location of the $E_1$ critical point and the most sensitive region of the optical properties to doping in silicon. The square profile shows that the dopant concentration is approximately a step function. The surface of the wafer is at 106 nm in the plot, while the deepest part of the doping is at 0 nm, indicating a doping depth of 106 nm.

It should be appreciated that the step function profile shown in FIG. 5 is one of many different possibilities of how the concentration of dopant varies with depth into the wafer. Whether the sample is a single layer with multiple regions or multiple layers, the concentration of dopant as a function of depth may change uniformly or non-uniformly. For example, although FIG. 5 displays a step function profile, an exponential profile, linear rising profile, linear decreasing profile, constant profile, or any combination or permutations of the concentration of dopant as a function of depth are within the scope of the present invention. The relationship between the dopant concentration and depth in the sample may be expressed in a functional form or a numerical form. Irrespective of how the relationship is expressed or the graphical representation, there is a one-to-one correspondence between the density of the dopant and the distance from the surface of the wafer, which is expressed as the doping density profile.

FIG. 6 displays the results of fitting the experimental data by adjusting the theoretical doping density profile in terms of Tan($\Psi$). FIG. 7 displays the results of fitting the experimental data by adjusting the theoretical doping density profile in terms of Cos($\Delta$). These figures show the excellent fit between generated and measured Tan($\Psi$) and Cos($\Delta$) data for an ion-implanted and annealed sample. The experimental data is shown as dashed lines, while the fit is shown as solid lines. Experimental data and generated fit are shown for four angles of incidence 60, 65, 70, and 75 degrees. It should be appreciated that it is only possible to obtain the quality of fit shown in FIG. 6 and FIG. 7 by accounting for the change in the optical properties of silicon with doping density (e.g., by using the dielectric function of doped silicon).

FIG. 8 displays a flow diagram depicting a method of determining the doping density profile of a sample. At step 800, light is emitted toward a sample (i.e., silicon wafer). At step 802, the phase shift and intensity ratio of the light reflected off the sample (i.e., reflected light) is measured. A variety of reflectometry technologies including ellipsometry may be used to measure the aspects of the optical properties identified in the present application. At step 804, the differences in the optical properties of doped and undoped crystal silicon as a function of doping density are asserted. The optical properties of the doped silicon are a function of the dopant (i.e., the concentration of the dopant). In one embodiment, prior to taking this measurement, an initial calibration of the optical properties versus doping concentration is performed as discussed above. During implementation, the Ellipsometry spectrum of Psi and Delta in the visible region are measured and then the doping density versus depth and the optical properties associated with the doping density as a function of depth are asserted. For example, in one embodiment, both the thickness of the doped region and the concentration versus depth of the dopant are asserted. The correspondence between the doping density and the depth are defined. In one embodiment, the thickness is the layer thickness in a model of the sample and the doping concentration includes the optical constants for doped silicon based on initial estimates of the dopant. The computation process would require adjusting both the dopant density profile as expressed through the optical constants and the thickness.

Generally speaking, the one-to-one correspondence between doping density and optical properties and the one-to-one correspondence between doping density and depth in the sample are related so that a one-to-one correspondence between the optical properties and the depth profile of dopants in the sample may be made. The computation process is an optimization process or optimization problem. For example, in one embodiment, the calculated and measured Psi-Delta spectrum are compared using a least-squares method. The optical properties as determined from the depth profile are interactively adjusted until an optimum match is achieved between the measured spectrum and the calculated spectrum. The optimum match represents the doping density profile as stated at 810.

As mentioned previously, a lookup table may be used to identify the optical constants of silicon versus the doping concentration. The lookup table is initially generated through a calibration procedure that involves determination of the dielectric function or optical constants as a function of wavelength for each concentration of dopant (i.e., $1\times10^{18}$, $2\times10^{18}$, $3\times10^{18}$, up to $1\times10^{22}$). In addition, based on the operator's knowledge of the ion implantation process, a good initial prediction of the doping density profile may be asserted. The optical properties (i.e., dielectric function versus energy as a function of depth) are then asserted for the doping density profile based on the input from the ion implantation process. The doping density profile is adjusted, which in turn results in a change in the optical constants, since the optical constants are expressed in terms of the doping density profile. The doping density profile is iteratively adjusted in order to produce an optimum match between the calculated psi-delta spectra and the measured psi-delta spectra. As stated at 810, the match between the calculated and the theoretical values are optimized. As stated at 812, the final values of the optical constants and doping density profile constitute the measured result.

A number of alternate methods may be implemented and are within the scope of the present invention. In one embodiment, the sample is only partially healed and there is a mixture of doped crystal silicon and amorphous silicon in the near surface region. In this scenario, an approximation must be made that addresses the optical properties of a mixture of two materials. The Brugeman approximation may be used to describe the optical properties of a mixture of two or more materials.

In manufacturing, the foregoing method may be implemented in an instrument. The instrument may be able to indicate that after the healing step, there is a mixture of amorphous silicon and doped silicon. For example, the instrument may be able to represent the doping density profile as a function of the percentage of amorphous silicon versus depth.

Another embodiment a three dimensional mapping of the doping density profile may be developed. The concentration of dopant as a function of depth may also be charted as a function of position on the wafer. Such as x-y position mapping would produce a three-dimensional mapping (x-y-z) of the doping density profile.

What is claimed is:

1. A method of processing a sample, comprising the steps of:

introducing dopant into a sample thereby producing a doped sample;

producing a completely healed sample including a doping density profile in response to introducing the dopant into the sample; and measuring the doping density profile of the completely healed sample by performing reflectometry using light generated within the visible wavelength spectrum.

2. A method of processing a sample as set forth in claim 1, wherein the step of introducing dopant into the sample is performed with ion implantation.

3. A method of processing a sample as set forth in claim 1, wherein the step of introducing dopant into the sample is performed using diffusion.

4. A method of processing a sample as set forth in claim 1, wherein the step of introducing dopant into the sample is performed by depositing a layer of doped crystal silicon on a semiconductor wafer.

5. A method of processing a sample as set forth in claim 1, wherein the healed sample is produced in response to an annealing step.

6. A method of processing a sample as set forth in claim 1, wherein the healed sample does not include an abrupt interface.

7. A method of processing a sample as set forth in claim 1, wherein the healed sample has a consistent crystal lattice structure.

8. A method of processing a sample as set forth in claim 1, wherein the visible wavelength spectrum is from about 3 eV to about 5 eV.

9. A method of processing a sample as set forth in claim 1, further comprising the step of controlling the manufacture of a semiconductor product in response to measuring the doping density profile.

10. A method of processing a sample, comprising the steps of:
producing a processed sample by introducing dopant into the sample in a manner that does not produce an interface in the sample, the sample including a doping density profile in response to introducing dopant into the sample; and
determining the doping density profile using reflectometry of the processed sample after complete annealing, wherein the reflectometry is performed using light generated in the visible light spectrum.

11. A method of manufacturing an integrated circuit as set forth in claim 10, wherein the visible light spectrum is from about 3 eV to about 5 eV.

12. A method of determining a doping density profile, comprising the steps of:
producing a sample, the sample comprising a first region of undoped crystal silicon including a first crystal lattice structure covering a second region of undoped crystal silicon including a second crystal lattice structure;
introducing dopant into the sample thereby damaging the first crystal lattice structure, the sample including a doping density profile in response to introducing the dopant;
producing a completely healed sample by healing the first crystal lattice structure to closely match the second crystal lattice structure such that there is little or no amorphous silicon present; and
determining the doping density profile by irradiating the healed sample with light that can be focused to less than 1 millimeter.

13. A method of determining a doping density profile as set forth in claim 12, wherein the doping density profile is characterized by an abrupt change in doping concentration between the first region and the second region.

14. A method of determining a doping density profile as set forth in claim 12, wherein the doping density profile is characterized by a gradual change in doping concentration between the first region and the second region.

15. A method of determining a doping density profile as set forth in claim 12, wherein the light that can be focused on the sample includes light within the visible wavelength spectrum.

16. A method of determining a doping density profile as set forth in claim 12, wherein the light that can be focused on the sample includes light including wavelength between about 3 eV to about 5 eV.

17. A method of processing a semiconductor sample, the semiconductor sample comprising optical properties as a function of dopant density, the semiconductor sample including at least two regions without a distinct interface between said at least two regions, the method comprising the steps of:
generating at least one predicted behavior curve associated with changes in the optical properties as a function of dopant density, the predicted behavior curve including at least one expected optical measurement and a depth profile;
generating at least one measured optical measurement by emitting light within the visible wavelength spectrum onto the sample after the sample is completely healed; and
determining the dopant density by comparing the predicted behavior curve to the at least one measured optical measurement.

18. A method of processing a semiconductor sample including optical properties, comprising the steps of:
introducing dopant into the semiconductor sample;
producing a sample with a doping density profile in response to introducing the dopant into the semiconductor sample;
directing light within a visible wavelength spectrum at the sample after the sample is completely healed;
measuring a change in the optical properties of the completely healed sample, in response to directing light in the visible wavelength spectrum at the completely healed sample, the change in the optical properties of the completely healed sample resulting from introducing the dopant into the sample; and
determining the doping depth profile in response to measuring the change in the optical properties of the completely healed sample.

19. A method of processing a semiconductor sample including optical properties, as set forth in claim 18, wherein the visible wavelength spectrum is from about 3 e.V. to about 5 e.V.

* * * * *